United States Patent
Doerner (10) Patent No.: US 9,450,617 B2
(45) Date of Patent: Sep. 20, 2016

(54) DISTRIBUTION AND REPLICATION OF ERASURE CODES

(71) Applicant: Quantum Corporation, San Jose, CA (US)

(72) Inventor: Don Doerner, San Jose, CA (US)

(73) Assignee: Quantum Corporation, San Jose, CA (US)

( * ) Notice: Subject to any disclaimer, the term of this patent is extended or adjusted under 35 U.S.C. 154(b) by 134 days.

(21) Appl. No.: 14/455,529

(22) Filed: Aug. 8, 2014

(65) Prior Publication Data
US 2016/0043738 A1 Feb. 11, 2016

(51) Int. Cl.
*H03M 13/37* (2006.01)

(52) U.S. Cl.
CPC ....... *H03M 13/3761* (2013.01); *H03M 13/373* (2013.01)

(58) Field of Classification Search
CPC ............ H03M 13/154; G06F 11/1076; G06F 17/30598; G06F 11/2094; G06F 17/30
USPC .................................................. 714/758, 709
See application file for complete search history.

(56) References Cited

U.S. PATENT DOCUMENTS

| | | | | |
|---|---|---|---|---|
| 7,870,464 B2 * | 1/2011 | Hafner | ................ | G06F 11/1076 714/718 |
| 2005/0283537 A1 * | 12/2005 | Li | ........................ | H04L 67/104 709/240 |
| 2010/0241616 A1 * | 9/2010 | Murphy | ................ | G06F 11/004 707/661 |
| 2015/0227423 A1 * | 8/2015 | Reinart | ............... | G06F 11/1076 714/766 |
| 2016/0013815 A1 * | 1/2016 | Wideman | ............ | G06F 11/1453 714/766 |

* cited by examiner

*Primary Examiner* — David Ton
(74) *Attorney, Agent, or Firm* — Eschweiler & Associates, LLC (57) ABSTRACT

Example apparatus and methods selectively replicate some erasure codes associated with a message and selectively distribute, without replicating, other erasure codes associated with the message. The message may have k symbols and n erasure codes may have been generated for the message, $n>=k$. In one embodiment, erasure codes that store plaintext information from the message (e.g., un-encoded symbols) may be replicated (e.g., sent to all devices using erasure codes associated with the message) while erasure codes that do not store plaintext information may be distributed (e.g., selectively moved to less than all devices) without being replicated. Some (e.g., less than k) erasure codes that do not store plaintext information may be stored unencrypted in the cloud. The generator matrix will not be stored in the cloud.

27 Claims, 12 Drawing Sheets

| $\gamma_{1,1}$ | $\gamma_{1,2}$ | $\gamma_{1,3}$ | ... | |
| --- | --- | --- | --- | --- |
| $\gamma_{2,1}$ | $\gamma_{2,2}$ | $\gamma_{2,3}$ | ... | $\gamma_{2,K}$ |
| $\gamma_{3,1}$ | $\gamma_{3,2}$ | $\gamma_{3,3}$ | ... | $\gamma_{3,K}$ |
| ... | ... | ... | ... | ... |
| $\gamma_{N,1}$ | $\gamma_{N,2}$ | $\gamma_{N,3}$ | ... | $\gamma_{N,K}$ |

Prior Art Figure 3

| 1 | 0 | 0 | ... | 0 |
| --- | --- | --- | --- | --- |
| 0 | 1 | 0 | ... | 0 |
| 0 | 0 | 1 | ... | 0 |
| ... | ... | ... | ... | ... |
| $\gamma_{K+1,1}$ | $\gamma_{K+1,2}$ | $\gamma_{K+1,3}$ | ... | $\gamma_{K+1,K}$ |
| ... | ... | ... | ... | ... |
| $\gamma_{N,1}$ | $\gamma_{N,2}$ | $\gamma_{N,3}$ | ... | $\gamma_{N,K}$ |

DISTRIBUTION AND REPLICATION OF ERASURE CODES

BACKGROUND

Data that is stored or transmitted may be protected against storage media failures or other loss by storing extra copies, by storing additional redundant information, or in other ways. One type of redundancy based protection involves using erasure coding. Erasure coding uses additional redundant data to produce erasure codes that protect against 'erasures'. The erasure codes allow data portions that are lost to be reconstructed from the surviving data. The application of erasure codes to data storage may typically have been for the purpose of recovering data in the face of failures of hardware elements storing the data.

Adding redundancy introduces overhead that consumes more storage capacity or transmission bandwidth, which in turn adds cost. The overhead added by erasure code processing tends to increase as the protection level provided increases. To enhance data protection, different approaches for storing redundant copies of items have been employed. Erasure codes are one such approach. An erasure code is a forward error correction (FEC) code for the binary erasure channel. The FEC facilitates transforming a message of k symbols into a longer message with n symbols so that the original message can be recovered from a subset of the n symbols, k and n being integers, n>k. The symbols may be individual items (e.g., characters, bytes) or groups of items. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols are sufficient to recover the original message. Optimal codes may require extensive memory usage, CPU time, or other resources when n is large. Erasure coding approaches may seek to create the greatest level of protection with the least amount of overhead via optimal or near optimal coding. Different types of erasure codes have different efficiencies and tradeoffs in terms of complexity, resources, and performance.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless erasure code is distinguished from an erasure code that exhibits a fixed code rate.

Storage systems may employ rateless erasure code technology (e.g., fountain codes) to provide a flexible level of data redundancy. The appropriate or even optimal level of data redundancy produced using a rateless erasure code system may depend, for example, on the number and type of devices available to the storage system. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written and only eleven redundancy blocks are needed to reconstruct the original data that was protected by generating and writing the redundancy blocks, then the original data may be reconstructed even if nine of the redundancy blocks are damaged or otherwise unavailable. This may be referred to as an "11 of 20" erasure code system.

An EC system may be described using an NB notation, where B describes the total number of encoded symbols that can be produced for an input message and A describes the minimum number of the B encoded symbols that are required to recreate the message for which the encoded symbols were produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different locations. In the EC 10/16 example, the original message could be reconstructed from 10 verified fragments. Conventionally, the 16 encoded symbols have been treated equally.

Figure 1:
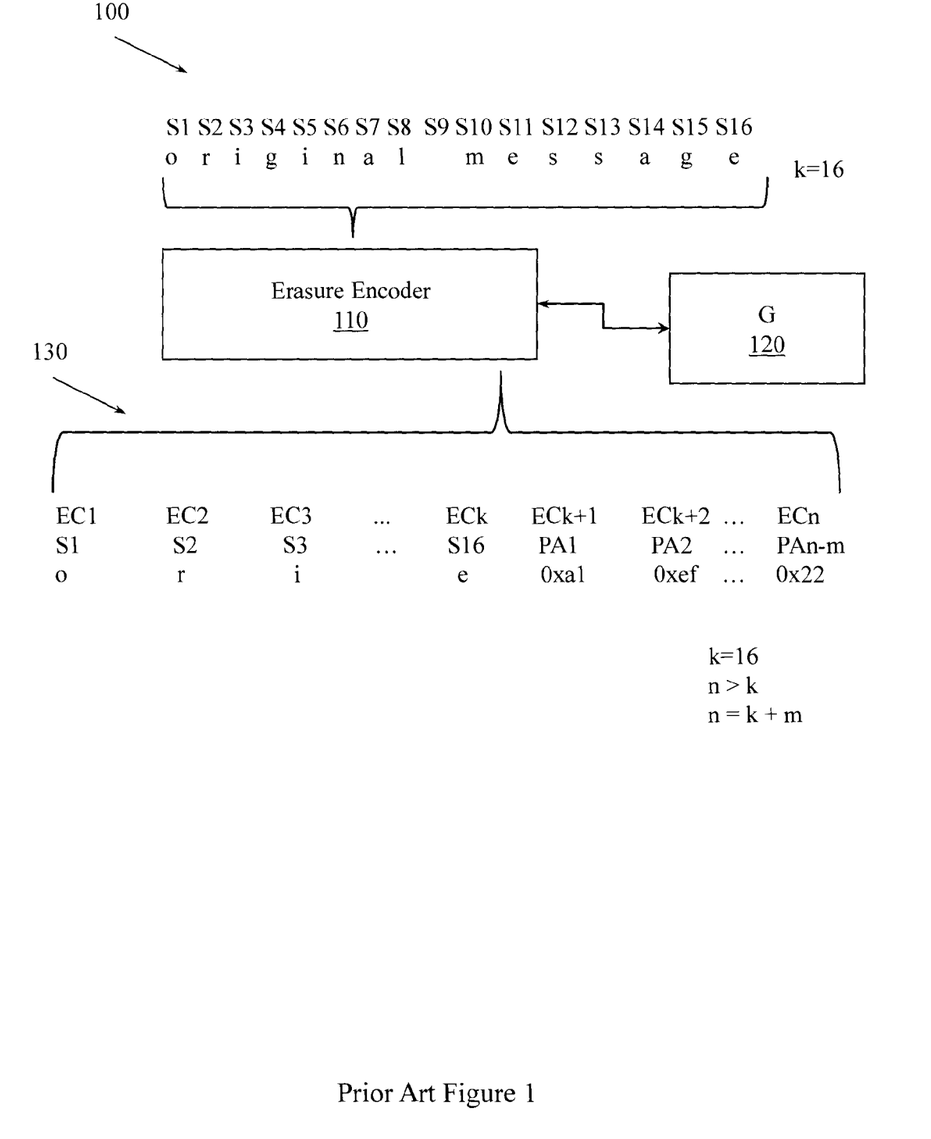
FIG. 1 illustrates an example set of systematic erasure codes.

Prior Art FIG. 1 illustrates an example set of systematic erasure codes. Prior Art FIG. 1 illustrates an original message 100 that has sixteen symbols S1, S2, . . . S16 (k=16) and that reads "original message". The symbols S1 . . . S16 may be referred to as the plaintext symbols for message 100. While the symbol size is one character, different symbol sizes may be employed. Message 100 is provided to erasure encoder 110. Erasure encoder 110 uses a generator matrix 120 to produce erasure codes 130. In this example, erasure encoder 110 produces erasure codes EC1, EC2, . . . ECn (n>k). The erasure codes include systematic erasure codes EC1 . . . EC16 (EC1 . . . ECk), which correspond directly to S1 . . . S16 (S1 . . . Sk). In this embodiment, at least EC1 . . . EC16 may be the same size as S1 . . . S16. For example, if the symbols S1 . . . S16 are one byte each, then the symbols EC1 . . . EC16 may also be one byte each. The erasure codes also include EC17 . . . ECn (ECk+1 . . . ECn), which do not correspond to any of S1 . . . Sk. In one embodiment, ECk+1 . . . ECn may be parity information. In another embodiment, ECk+1 . . . ECn may be other information that facilitates recreating the original message. In this embodiment, ECk+1 . . . ECn do not need to be the same size as S1 . . . S16. For example, if S1 . . . S16 are one byte, ECk+1 . . . ECn do not have to be one byte. While the systematic erasure codes are illustrated as being generated in order and in locations directly corresponding to the input message, in some embodiments, the systematic erasure codes may be distributed through the ECn codes and may be out of order.

The original message 100 can be recreated from any 16 of the systematic erasure codes EC1 . . . ECn. If EC1 . . . ECk are available, then original message 100 can be recreated without performing erasure code decoding. If any of EC1 . . . ECk are not available, then original message 100 can still be recreated but erasure code decoding would be necessary.

Figure 2:
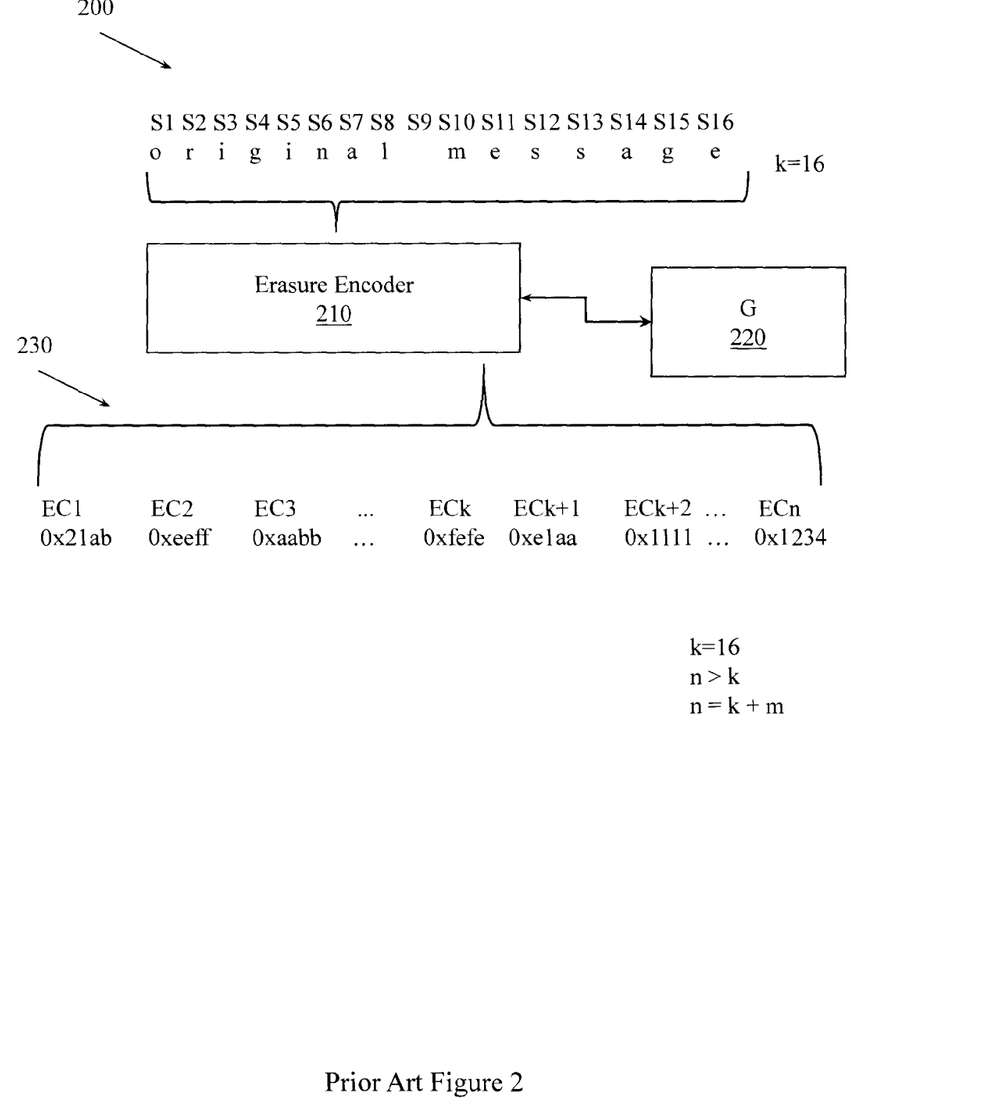
FIG. 2 illustrates an example set of non-systematic erasure codes.

Prior Art FIG. 2 illustrates an example set of non-systematic erasure codes. Prior Art FIG. 2 illustrates an original message 200 that also has sixteen symbols S1, S2, . . . S16 (k=16) and that reads "original message". While the symbol size is one character, different (e.g., larger) symbol sizes are likely to be employed. Message 200 is provided to erasure encoder 210. Erasure encoder 210 uses a generator matrix 220 to produce erasure codes 230. In this example, erasure encoder 210 produces non-systematic erasure codes EC1, EC2, . . . ECn (n>k). EC1, EC2, . . . ECn do not correspond directly to any of S1 . . . S16 as was the case for systematic erasure codes 130 (Prior Art FIG. 1). Instead, EC1, EC2, . . . ECn are the result of processing symbols S1 . . . S16 with the matrix 220 as controlled by erasure encoder 210. EC1, EC2, . . . ECn do not have to be the same size as S1 . . . S16. For example, S1 . . . S16 may be one byte each that represent one ASCII character each while EC1, EC2, . . . ECn are two bytes each.

Figure 3:
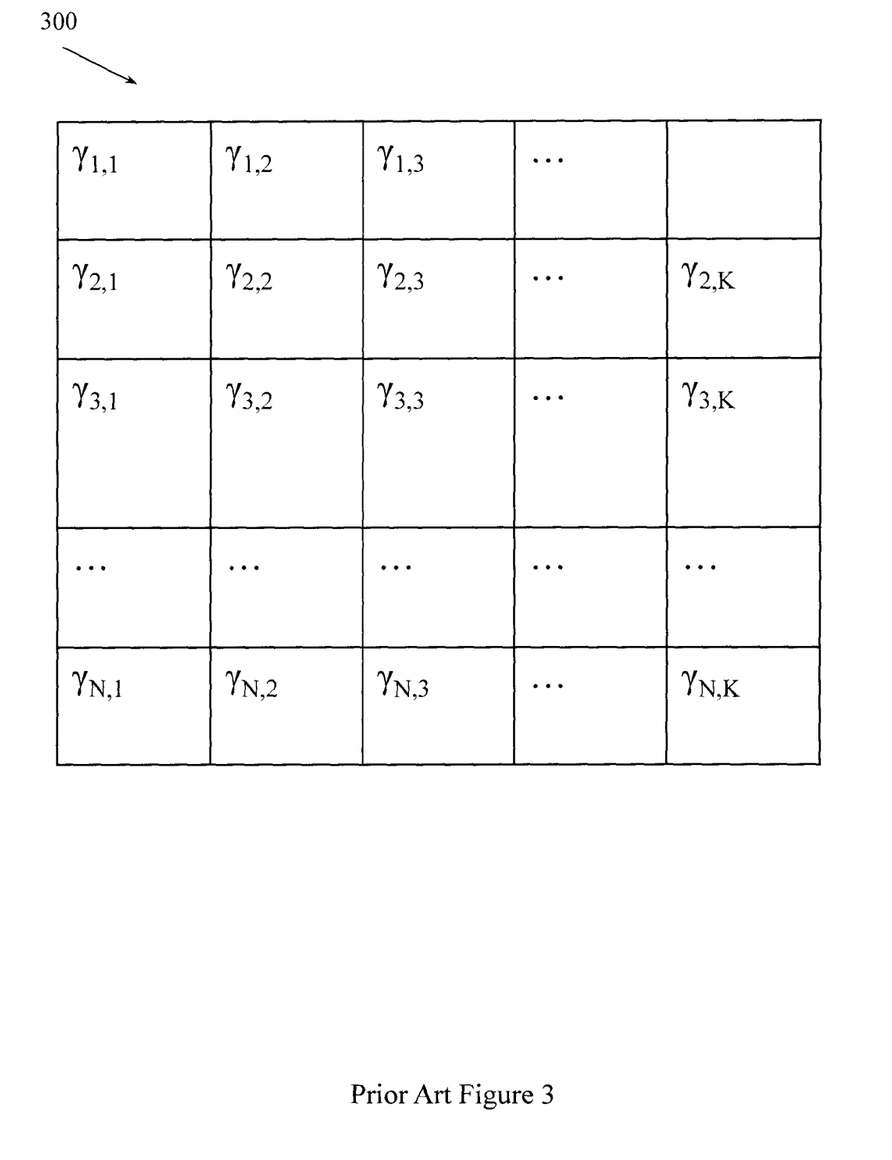
FIG. 3 illustrates a generator matrix.

Prior Art FIG. 3 illustrates a generator matrix 300. Typically, an erasure coder uses a generator matrix like matrix 300 for encoding data. An input message (e.g., plaintext) and the generator matrix 300 may be processed to produce erasure codes. For example, an input message and generator matrix 300 may be multiplied together using matrix multiplication to produce erasure codes.

Figure 4:
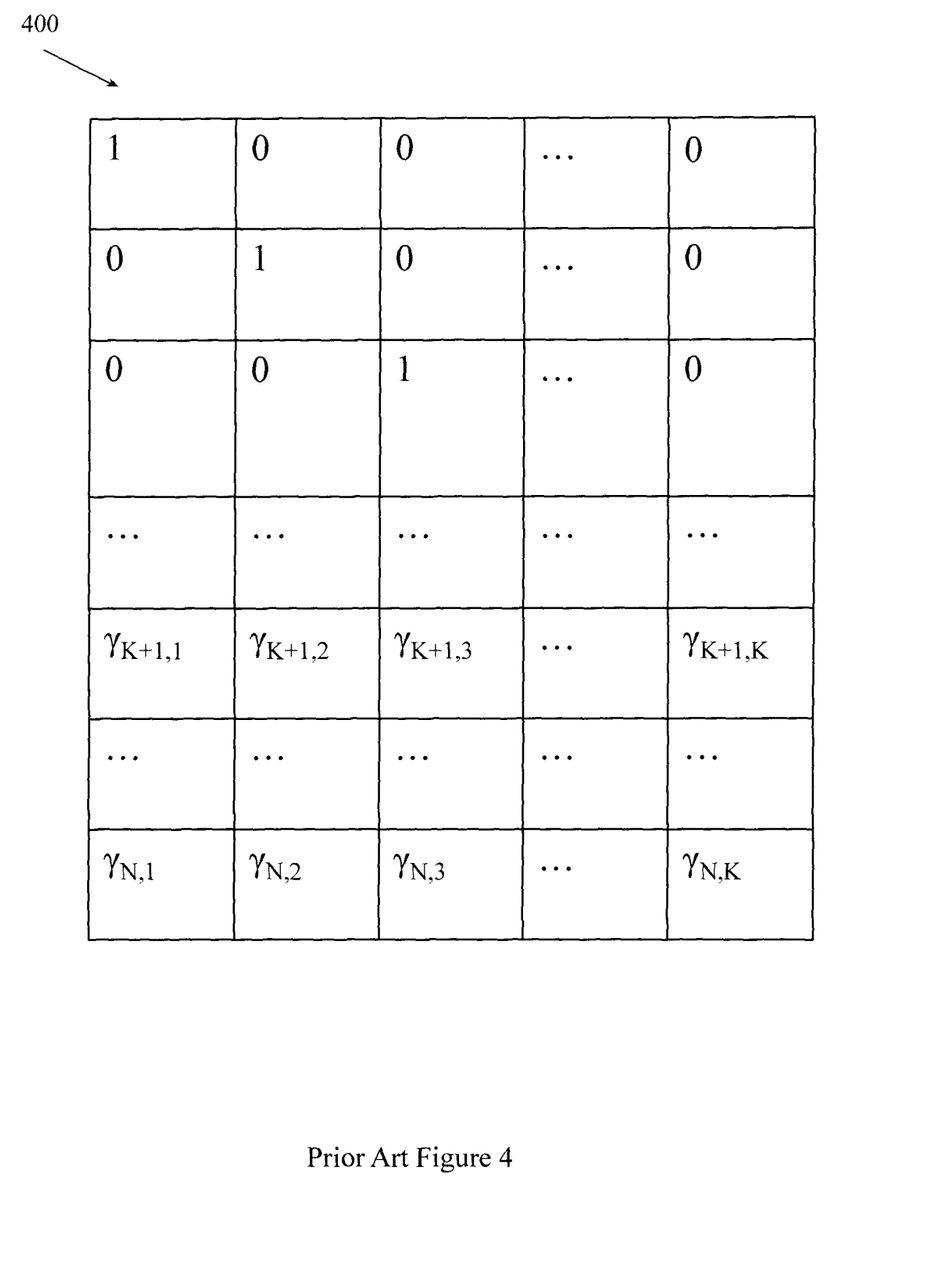
FIG. 4 illustrates a generator matrix for a systematic erasure code system where the upper sub-matrix is an identity matrix.

Prior Art FIG. 4 illustrates a generator matrix 400 for a systematic erasure code system where the upper sub-matrix is an identity matrix. When the systematic erasure code system uses generator matrix 400, some of the erasure codes produced may be symbols from the input message. Thus, for systematic erasure codes, the encoded symbols may be denoted [Sk:En] to reflect the fact that some encoded symbols are actually the original data.

Figure 5:
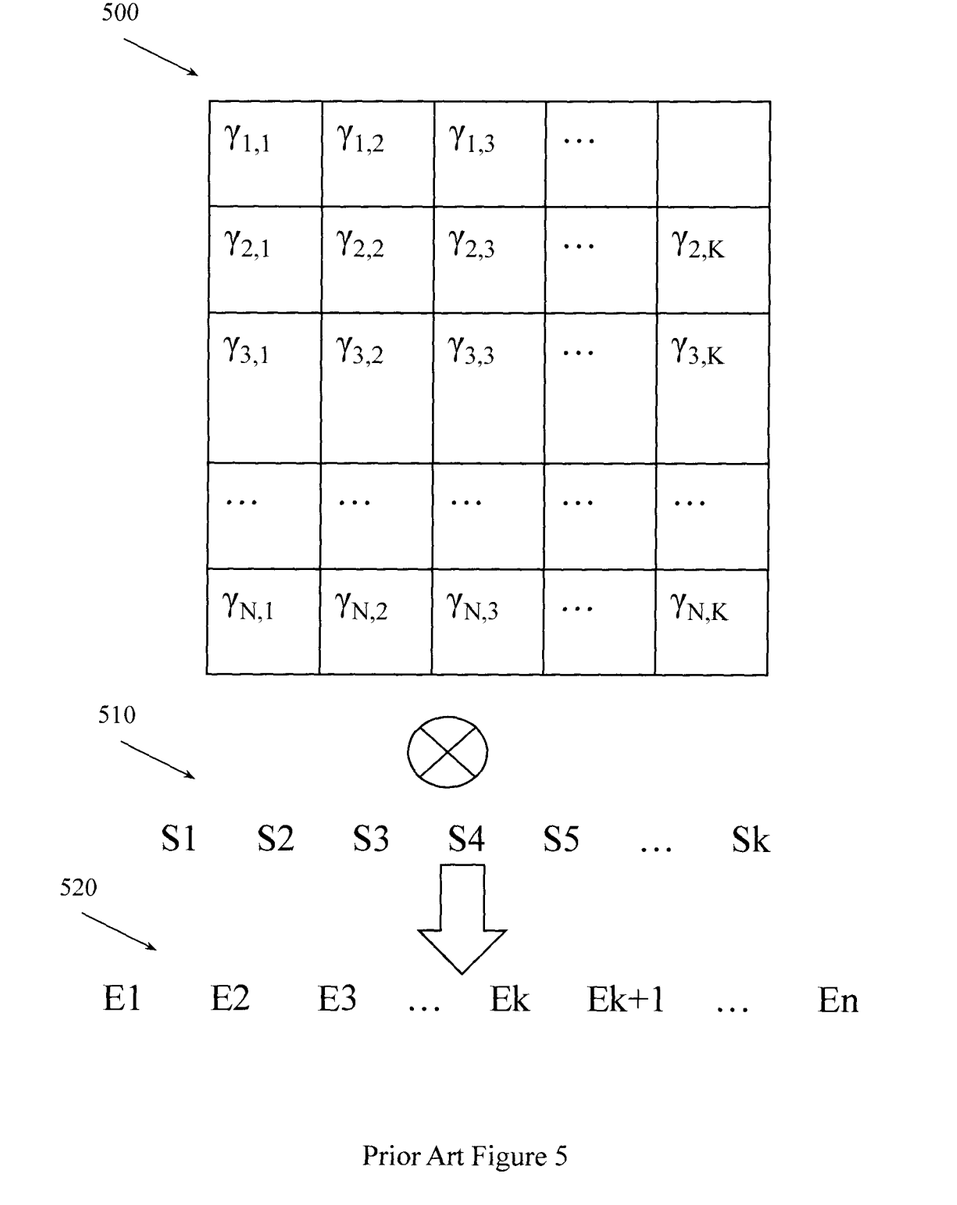
FIG. 5 illustrates example erasure code generation using a generator matrix and an input message.

Prior Art FIG. 5 illustrates example erasure code generation using a generator matrix 500 and an input message 510. The input message 510 is multiplied by generator matrix 500 using matrix multiplication to produce erasure codes 520. While the input message 510 had k symbols, the erasure codes 520 may have n symbols, where n>=k. In general, at least k symbols are required to decode the data. Decoding processes may vary by erasure code approach. For a systematic erasure code approach, if the erasure codes corresponding to the original input symbols are available, then no "decoding" is required, only re-assembly is required.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Prior Art

Prior Art

Prior Art

Prior Art

Prior Art

DETAILED DESCRIPTION

Example apparatus and methods control replication and distribution of erasure codes. Replicating an erasure code means that a copy of the erasure code is made and provided to another data store. After replication there is an additional copy of the erasure code stored in a different data store. Distributing an erasure code means that the erasure code is moved or otherwise copied to another data store. After distribution, there are the same number of copies of the erasure code.

Example apparatus and methods selectively replicate some erasure codes associated with a message and selectively distribute, without replicating, other erasure codes associated with the message. The message may have k symbols, and n erasure codes may have been generated for the message, n>=k. In one embodiment, erasure codes that store plaintext information from the message (e.g., unencoded symbols) may be replicated while erasure codes that do not store plaintext information may be distributed without being replicated. Some (e.g., less than k) erasure codes that do not store plaintext information may be stored unencrypted in the cloud.

Example apparatus and methods selectively make sites that are using the erasure codes aware of the matrix generator and selectively make the sites aware of how the erasure codes have been replicated and distributed. If a site experiences an erasure, the site may first attempt to correct for the erasure using locally available erasure codes. If the site is unable to correct for the erasure using locally available erasure codes, the site may request additional erasure codes from other sites that are using the erasure codes. The site that experienced the erasure may inform another site of which erasure codes it has intact so that the remote site may only send erasure codes that the requesting site does not already have.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
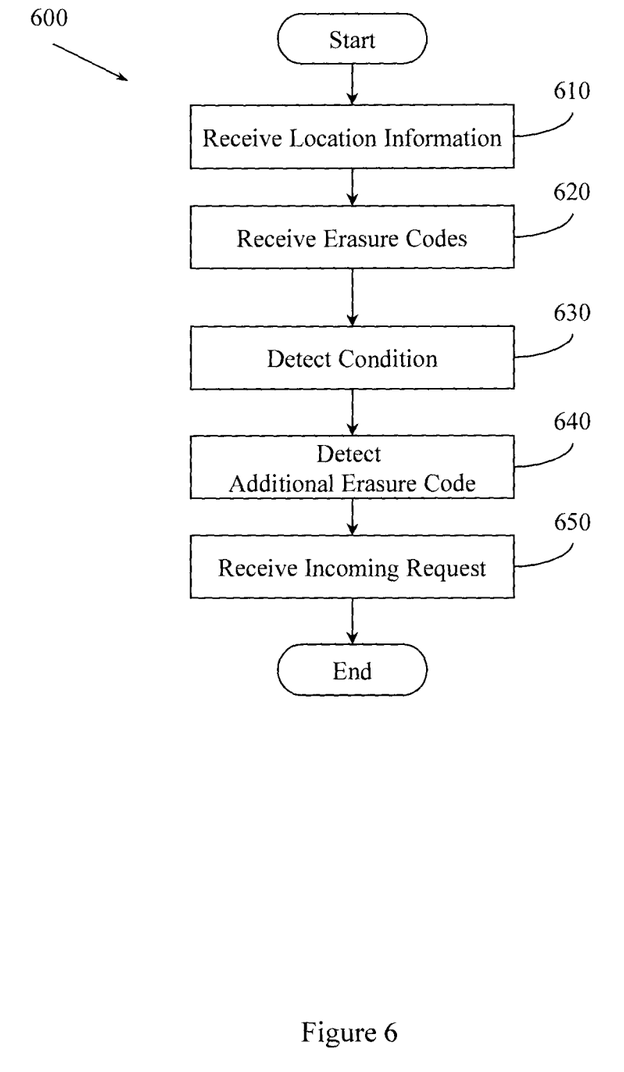
FIG. 6 illustrates an example method associated with distribution and replication of erasure codes.

FIG. 6 illustrates a method 600 associated with distribution and replication of erasure codes. Method 600 may include, at 610, receiving location information identifying a location or locations from which erasure codes can be requested. In one embodiment, the location may be a central location through which requests may be routed. In another embodiment, the locations may include a plurality of devices or apparatus through which requests may be provided to groups of data stores. In one embodiment, the location information identifies first data stores to which erasure codes were replicated and second data stores to which erasure codes were distributed.

Method 600 may include, at 620, receiving x out of y erasure codes produced for a message having k symbols, y being greater than or equal to k, x being less than or equal to y, x being sufficient to reconstruct the message. The erasure codes may be, for example, systematic erasure codes, not systematic erasure codes, rateless erasure codes, fountain codes, or other codes.

The x out of y erasure codes may be received from a provider. The provider may be, for example, a process, an apparatus, a server, a service, or other source of erasure codes. The provider may generate the set of y erasure codes based, at least in part, on a generator matrix. In one embodiment, method 600 may include receiving information concerning the generator matrix. Information about the generator matrix may be provided because reconstructing the message may depend, at least in part, on the generator matrix.

Method 600 may also include, at 630, detecting a condition that makes one or more of the x previously received erasure codes unavailable. The condition may be, for example, an erasure error where the code was erased, a device upon which the code was stored failed or became unavailable, or other condition. The condition may prevent the message from being able to be reconstructed using the erasure codes remaining from the x erasure codes that were received. When the condition is detected, method 600 may provide an outgoing request for an additional erasure code. The outgoing request identifies the erasure codes that were not affected by the condition and that are still available for reconstructing the message. In one embodiment, the outgoing request is provided to data stores to which erasure codes were duplicated or to data stores to which erasure codes were replicated. In another embodiment, the outgoing request is provided to a single apparatus or service that may route the outgoing request.

Method 600 may also include, at 640, detecting that an additional erasure code has been received in response to providing the outgoing request. When the additional erasure code is detected, method 600 may attempt to reconstruct the message based, at least in part, on the additional erasure code and the erasure codes that were not affected by the condition and are still available. The additional erasure code may be received from a data store to which erasure codes were replicated, from a data store to which erasure codes were duplicated, or from another device or process.

Method 600 may also include, at 650, receiving an incoming request for an additional erasure code from a requestor that experienced a condition that made an erasure code stored at the requestor unavailable to the requestor. The condition may be, for example, an erasure, a partial device failure, a complete device failure, a communication error, or other condition that can make an erasure code unavailable. The incoming request may include information identifying members of the y erasure codes that are still available at the requestor. In response to receiving the incoming request, method 600 may selectively provide to the requestor a member of the previously received x erasure codes that is not identified in the incoming request. If the recipient of the incoming request only has erasure codes that are already available at the requestor, then the recipient may not send any erasure codes. The recipient may, in this example, forward the request to another holder of erasure codes or send a reply indicating that it has no additional erasure codes. If the recipient of the incoming request has erasure codes that are not available at the requestor, then the recipient may provide one or more of the erasure codes that are not already available at the requestor.

The provider of the x of y erasure codes may provide erasure codes and other information to a number of apparatus or processes that perform method 600. For example, the provider may identify a set of sites that are using members of the set of y erasure codes and provide information about the generator matrix to the set of sites. The set of sites may include data stores, data storage devices, servers, computers, or other recipients. In one embodiment, the provider sends the generator matrix to the recipients.

The provider may also control replication and distribution of erasure codes. In one embodiment, the provider selects first members of the y erasure codes to be replicated. The first members may be, for example, a set of symbols that are sufficient to reconstruct the message. The first members may also include one or more additional (e.g., redundant) erasure codes. In one embodiment, the provider selects an erasure code to be replicated based, at least in part, on a probability that the erasure code will be read exceeds a first threshold. The first members may be sufficient to reconstruct a message from which the erasure codes were generated.

The provider may also select replication members of the set of sites to receive the first members. The provider may then replicate the selected first members to the replication members. Less than all sites that are using the erasure codes may be selected to be replication members. Thus, the provider may select which erasure codes are to be replicated and the data stores to which the erasure codes are to be replicated.

Having replicated the erasure codes to the replication members, the provider may then provide information about the first members and the replication members to selected members of the set of sites. The members will then have information that may facilitate routing or targeting a request for an additional erasure code.

The provider may also select second members of the y erasure codes to be distributed. In one embodiment, the provider selects an erasure code to be duplicated based, at least in part, on a probability that the erasure code will be read is less than a second threshold. For example, parity codes produced when systematic erasure codes are employed may only be read in the event of an error and thus the probability may be low. The provider may also select data stores to receive the distributed erasure codes. The provider may then distribute the second members to the distribution members selected to receive the distributed erasure codes.

Having distributed erasure codes to certain data stores, the provider may then provide information about the second members and the distribution members to the selected members of set of sites. This information may allow a data store to route, target, or otherwise address an outgoing request for an additional erasure code.

The provider may choose different data stores to receive erasure codes. In one embodiment, the provider may cause one or more of the y erasure codes to be stored, unencrypted, in a publicly accessible storage. In this embodiment, less than the number of erasure codes that are needed to reconstruct the message may be stored in the public data store.

Figure 7:
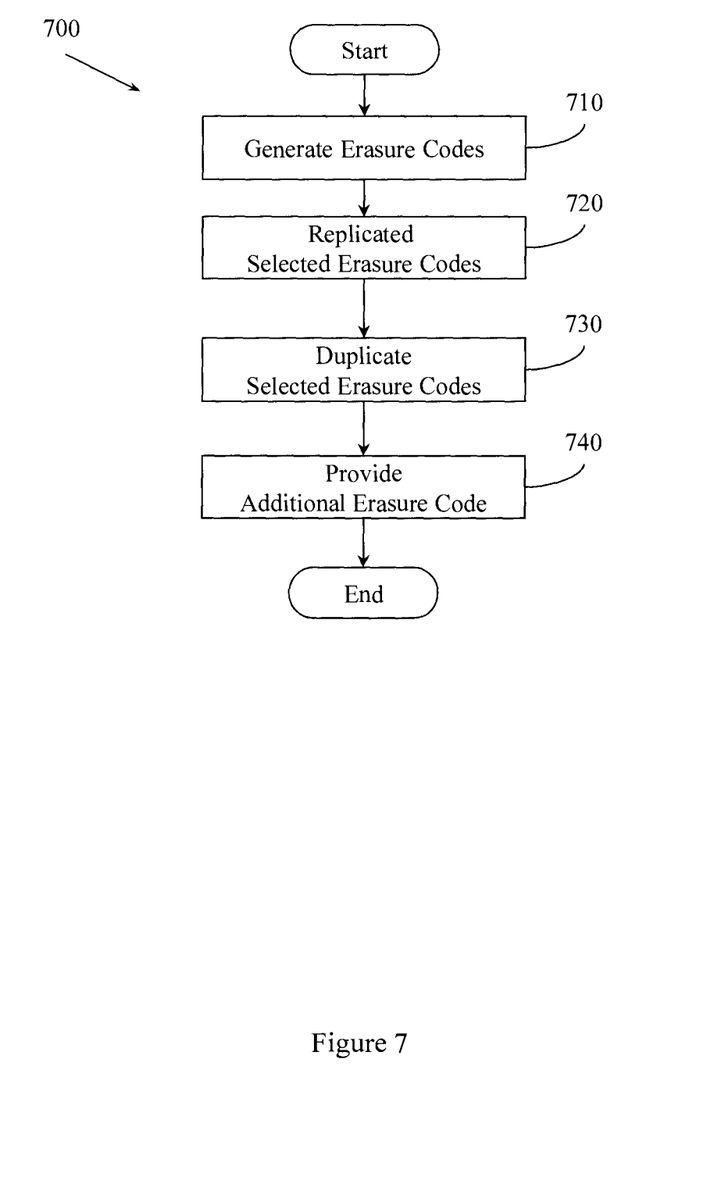
FIG. 7 illustrates an example method associated with distribution and replication of erasure codes.

FIG. 7 illustrates an example method 700 associated with distribution and replication of erasure codes. Method 700 includes, at 710, generating a plurality of erasure codes for a message. In one embodiment, generating the plurality of erasure codes depends, at least in part, on a generator matrix. In one embodiment, method 700 may include providing the generator matrix to selected members of the replication receivers.

Method 700 also includes, at 720, replicating selected members of the plurality to one or more replication receivers. Replicating an erasure code includes causing a copy of the erasure code to be provided to another data store. After replication, there is an additional copy of the erasure code located in another data store.

Method 700 also includes, at 730, duplicating selected members of the plurality to one or more duplication receivers. Duplicating an erasure code includes causing a copy of the erasure code to be provided to another data store and then removing the local copy. After distribution, there are the same number of copies of the erasure code but the erasure code has been relocated.

Method 700 also includes, at 740, upon determining that a user of the erasure codes does not have enough erasure codes to reconstruct the message, providing a selected member of the plurality of erasure codes to the user. Method 700 may determine that the user does not have enough erasure codes based, for example, on receiving a message from the user. In one embodiment, providing a selected member of the plurality of erasure codes includes controlling a replication receiver to send an additional erasure code to the user. Additionally and/or alternatively, providing a selected member of the plurality of erasure codes may include controlling a duplication receiver to send an additional erasure code to the user.

At least one of the distribution receivers may be a public data store. The public data store may be located, for example, in the cloud. In one embodiment, duplicating selected members of the plurality to a duplication receiver at 730 may include storing selected members of the plurality in a public data store without encrypting the selected members of the plurality.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Object", as used herein, refers to the usage of object in computer science. From one point of view, an object may be considered to be a location in a physical memory having a value and referenced by an identifier.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
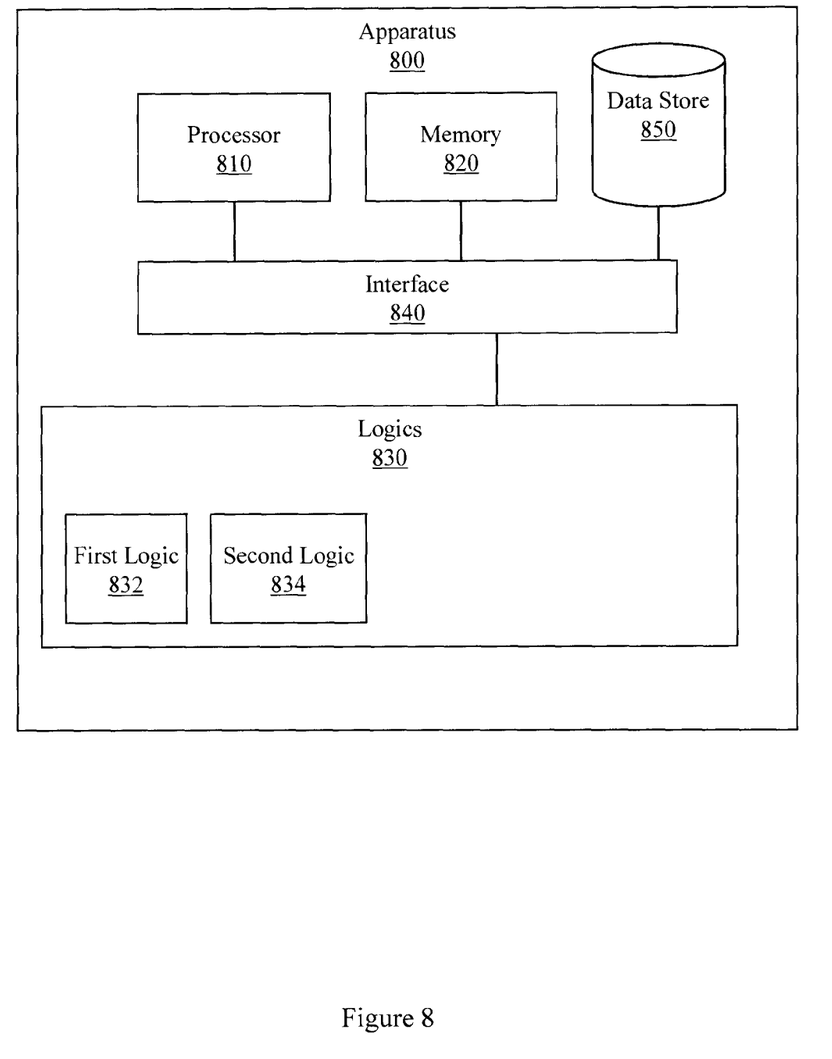
FIG. 8 illustrates an example apparatus associated with distribution and replication of erasure codes.

FIG. 8 illustrates an apparatus 800 that includes a processor 810, a memory 820, a data store 850, and a set 830 of logics that is connected to the processor 810, memory 820, and data store 850 by an interface 840. In one embodiment, the apparatus 800 may be a stand-alone device connected to a data communication network. In another embodiment, apparatus 800 may be integrated into another device (e.g., deduplication apparatus) or system (e.g., object storage system). The data store 850 stores a set of erasure codes associated with a message. The erasure codes may be, for example, systematic erasure codes, non-systematic erasure codes, fountain codes, rateless erasure codes, or other erasure codes. In one embodiment, the set of erasure codes stored in data store 850 is sufficient to reconstruct the message.

The memory 820 stores electronic data that identifies a provider from which an additional erasure code associated with the message can be requested. In one embodiment, the provider may be a central site through which other sites to which erasure codes were distributed or replicated may be accessed. In one embodiment, the provider may be a site to which erasure codes were distributed or replicated. Different combinations of providers may be supported. While the data store 850 is illustrated separately from memory 820, in one embodiment the data store 850 may be implemented in the memory 820. While the data store 850 is illustrated internal to apparatus 800, in one embodiment, the data store 850 may be external to apparatus 800.

The set 830 of logics may control distribution and replication of erasure codes. Thus, the set 830 of logics may include a first logic 832 that detects when the set of erasure codes stored in data store 850 is insufficient to reconstruct the message. The set of erasure codes may have become insufficient due, for example, to an erasure error or other action. Upon determining that apparatus 800 no longer has sufficient erasure codes to reconstruct the message, the first logic 832 may send a request for an additional erasure code associated with the message to the provider. The request identifies members of the set of erasure codes that are currently available for reconstructing the message.

The apparatus 800 may also include a second logic 834 that detects when an additional erasure code has been received in response to the request. Multiple copies of the same additional erasure code may be received from different providers in response to the request. When the second logic 834 detects the arrival of an additional erasure code, the second logic 834 selectively stores the additional erasure code in the data store 850 upon determining that the additional erasure code is not already stored in the data store 850.

Figure 9:
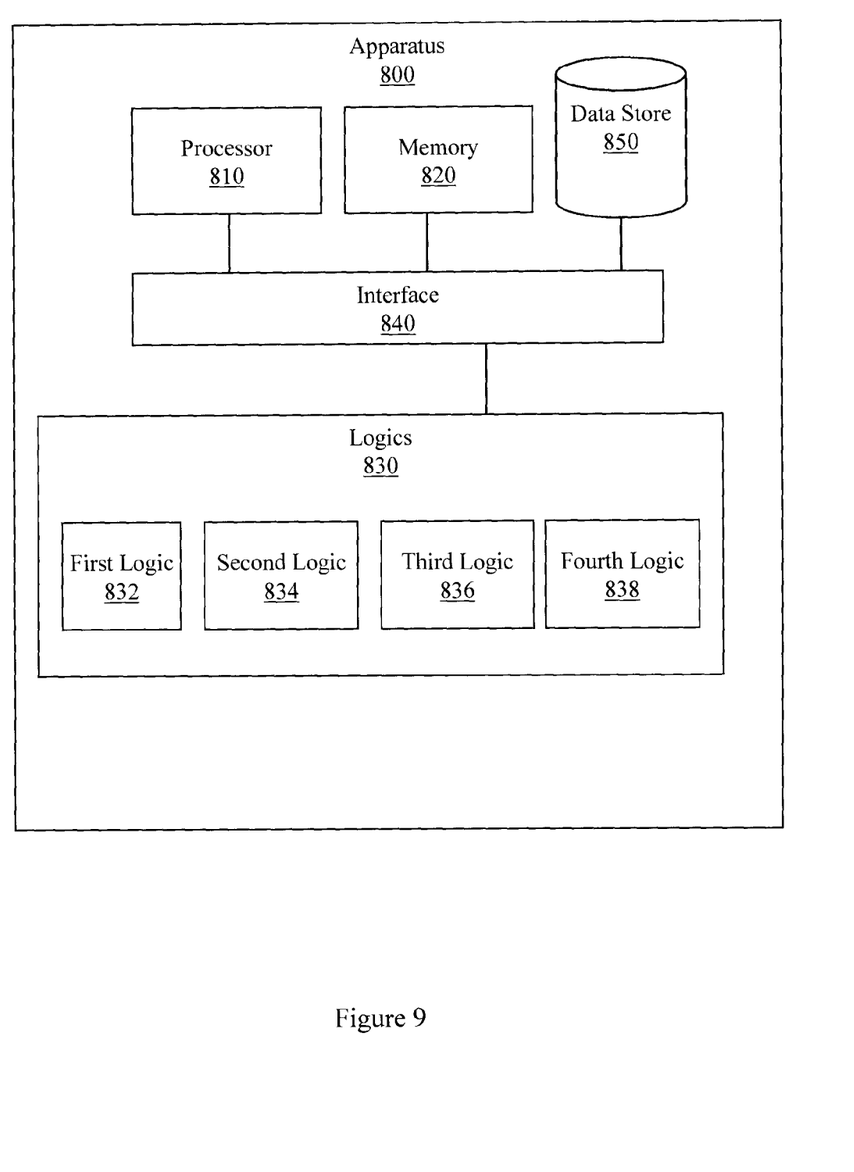
FIG. 9 illustrates an example apparatus associated with distribution and replication of erasure codes.

FIG. 9 illustrates another embodiment of apparatus 800. This embodiment includes a third logic 836. The third logic 836 detects incoming requests for additional erasure codes. Upon detecting an incoming request for an additional erasure code from a requester, the third logic 836 selectively provides a member of the set of erasure codes stored in data store 850 to the requester. To avoid sending erasure codes that the requester already has, in one embodiment, the third logic 836 provides an erasure code that the requester did not identify in the incoming request. Different types of erasure codes may be available in data store 850. Therefore, in one embodiment, the third logic 836 prioritizes providing an erasure code from which the message can be reconstructed without decoding over an erasure code from which the message can be reconstructed with decoding. For example, when systematic erasure codes are in use, erasure codes that include plaintext symbols from the message may be prioritized over encoded symbols.

This embodiment of apparatus 800 also includes a fourth logic 838. The fourth logic 838 detects when an additional erasure is added to the data store 850. Upon detecting that an additional erasure code has been added to the data store 850, and upon determining that apparatus 800 had experienced a state where it had insufficient erasure codes to reconstruct the message, fourth logic 838 may attempt to reconstruct the message from the erasure codes now stored in the data store 850. When systematic erasure codes are available, reconstructing the message may include assembling plaintext symbols into the message. When less than an entire set of plaintext symbols are available when systematic erasure codes are in use, reconstructing the message may include decoding erasure codes. When non-systematic erasure codes are in use, reconstructing the message may include decoding erasure codes. Decoding erasure codes may include performing an inverse operation with a matrix that was used to generate the erasure codes. If the fourth logic 838 is unable to reconstruct the message because insufficient erasure codes are available, fourth logic 838 may signal first logic 832 that apparatus 800 still has insufficient erasure codes.

Figure 10:
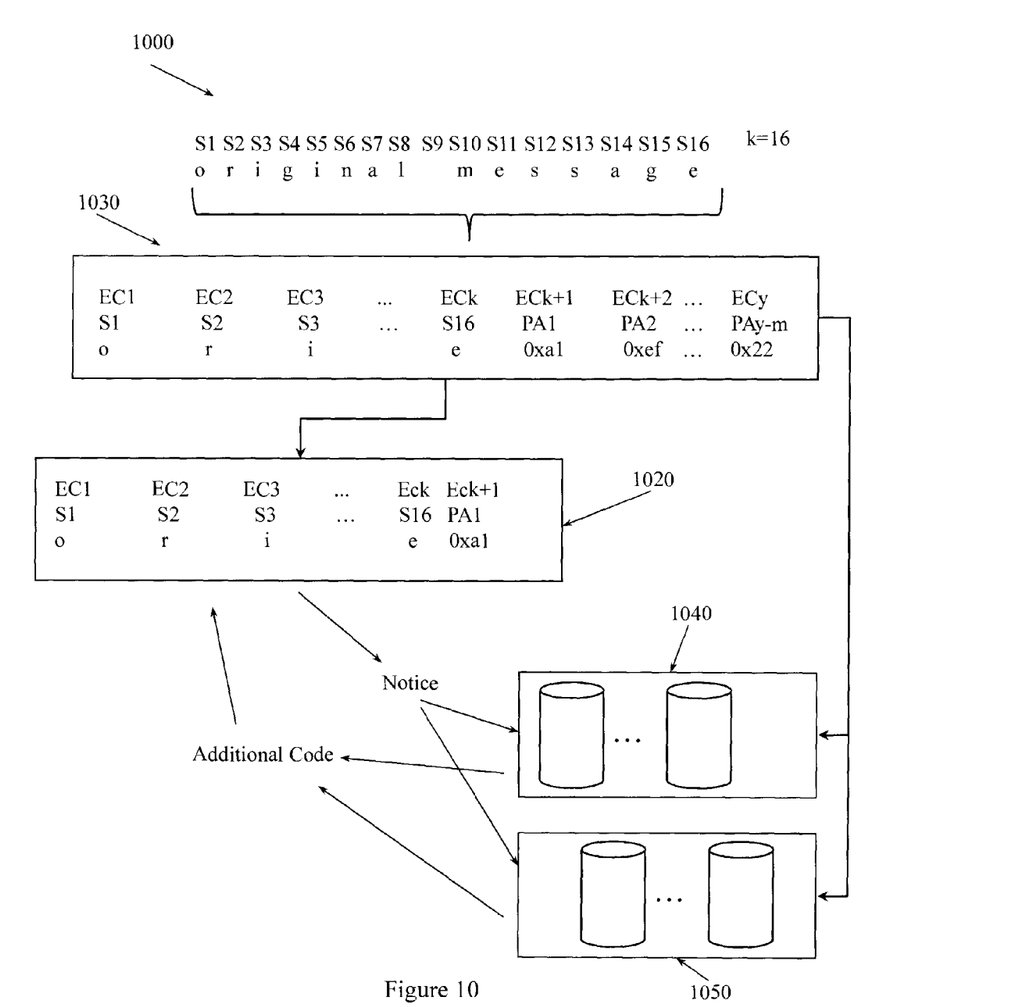
FIG. 10 illustrates a data flow associated with distribution and replication of erasure codes.

FIG. 10 illustrates a data flow associated with distribution and replication of erasure codes. Erasure codes 1030 may be generated for a message 1000. Selected members of the erasure codes 1030 may be duplicated and sent to data stores 1040. Selected members of the erasure codes 1030 may be replicated and sent to data stores 1050. One data store 1020 may have received a subset of the erasure codes 1030. When systematic erasure codes are being used, the subset of erasure codes at 1020 may include plaintext symbols from message 1000. If sufficient plaintext symbols are available, then the message 1000 may be reconstructed from the subset at 1020 without having to do erasure code decoding. Thus, in one embodiment, the erasure codes selected for replication may include the subset EC1 . . . ECk while the erasure codes selected for distribution may include the parity codes ECk+1 . . . ECy. Different combinations of plaintext symbols and parity symbols may be distributed or replicated.

If data store 1020 experiences a condition where it is no longer able to reconstruct message 1000 from the erasure codes at data store 1020, then data store 1020 may send a notice concerning the condition. The notice may identify which erasure codes are still available at data store 1020. The notice may be provided to data stores 1040 to which erasure codes were distributed or data stores 1050 to which erasure codes were replicated. In response to the notice, an additional erasure code may be provided to data store 1020.

Figure 11:
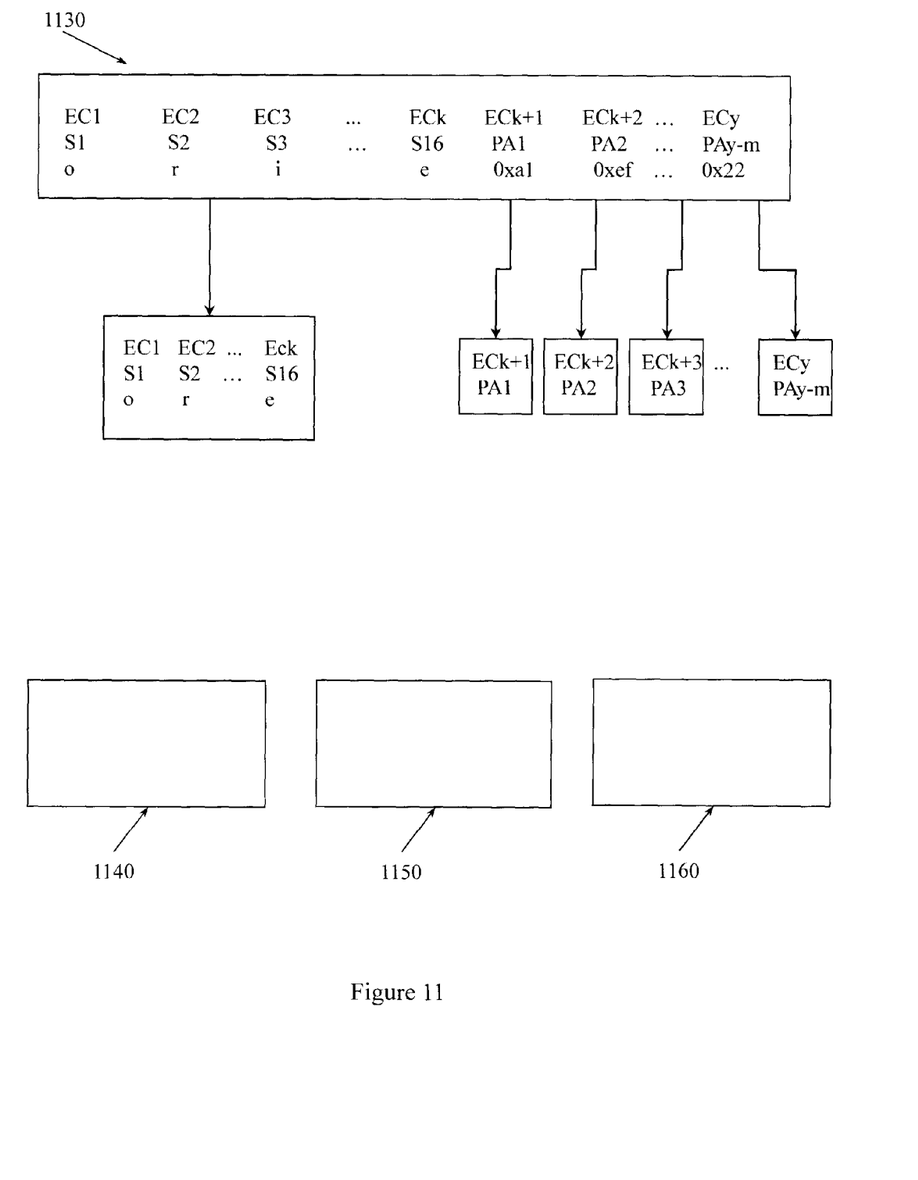
FIG. 11 illustrates an example system before distribution and replication of erasure codes.

FIG. 11 illustrates a system before distribution and replication of erasure codes to data stores 1140, 1150, and 1160. A set 1130 of erasure codes EC1 . . . ECk Eck+1 . . . ECy may have been generated for a message having k symbols. When systematic erasure codes are in use, a subset EC1 . . . ECk of the erasure codes may be symbols from which the message can be reconstructed without performing erasure code decoding. While the subset EC1 . . . ECk is illustrated having consecutive contiguous symbols, different subsets may be selected. When systematic erasure codes are in use, erasure codes ECk+1 . . . ECy may be, for example, parity symbols. To reconstruct the message based, at least in part, on erasure codes ECk+1 . . . ECy, it may be necessary to perform erasure code decoding. In one embodiment, the erasure codes ECk+1 . . . ECy may be selected for distribution while the erasure codes EC1 . . . ECk may be selected for replication.

Figure 12:
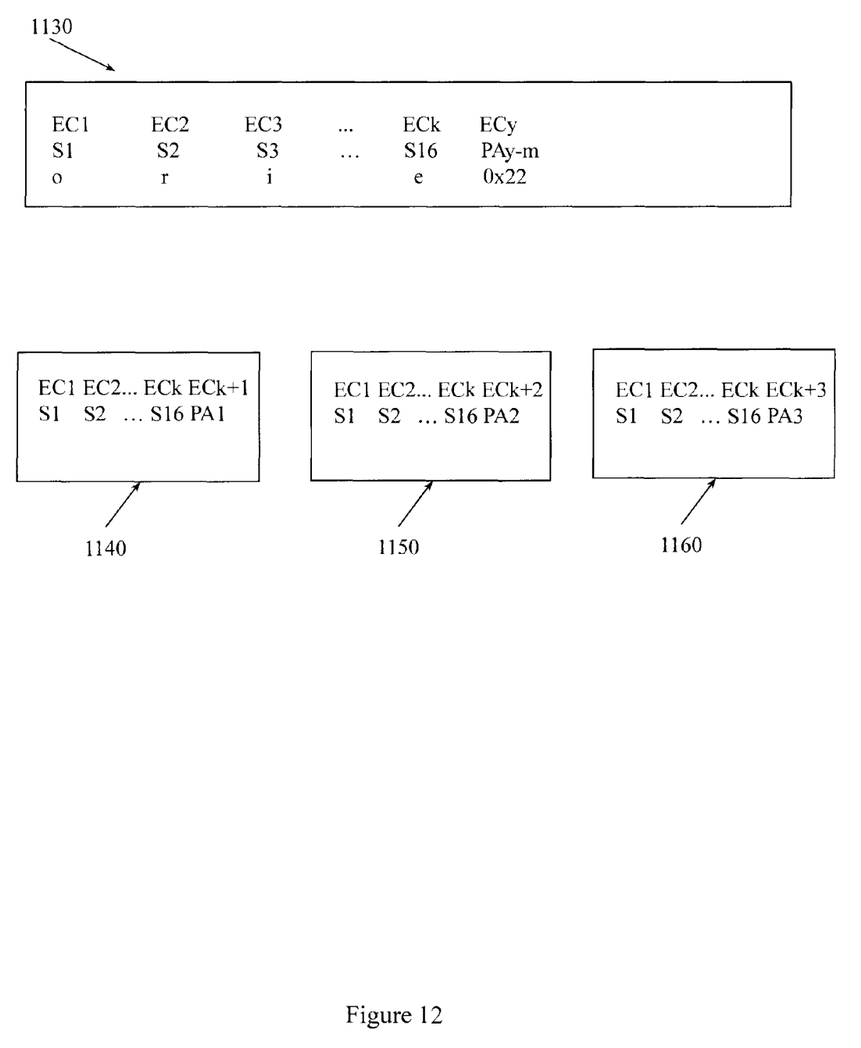
FIG. 12 illustrates an example system after distribution and replication of erasure codes.

FIG. 12 illustrates the system after distribution and replication of erasure codes. The erasure codes EC1 . . . ECk have been replicated to each of data stores 1140, 1150, and 1160. Members of the erasure codes ECk+1 . . . ECy have been distributed to data stores 1140, 1150, and 1160.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A method, comprising:
receiving x out of y erasure codes produced for a message, where the message has k symbols, y being greater than or equal to k, x being less than or equal to y, x being sufficient to reconstruct the message;

upon detecting a condition that makes one or more of the x erasure codes unavailable and that prevents the message from being reconstructed using the x erasure codes, providing an outgoing request for an additional erasure code, where the outgoing request identifies a subset of the x erasure codes that were not affected by the condition and that are still available for reconstructing the message, and upon detecting that an additional erasure code has been received in response to providing the outgoing request, reconstructing the message based, at least in part, on the additional erasure code and the x erasure codes that were not affected by the condition and that are still available.

2. The method of claim 1, comprising:
upon receiving an incoming request for an additional erasure code from a requestor that experienced a condition that made an erasure code stored at the requestor unavailable to the requestor, where the incoming request includes information identifying members of the y erasure codes that are present at the requestor, providing, to the requestor, a member of the x erasure codes that is not identified in the incoming request.

3. The method of claim 1, comprising:
receiving location information identifying one or more locations from which members of the y erasure codes can be requested.

4. The method of claim 3, where the location information identifies first data stores to which members of the y erasure codes were replicated and second data stores to which members of the y erasure codes were distributed.

5. The method of claim 4, where the outgoing request is provided to one or more members of the first data stores or to one or more members of the second data stores.

6. The method of claim 5, where the additional erasure code is received from a member of the first data stores or from a member of the second data stores.

7. The method of claim 1, where the x out of y erasure codes are received from a provider that generates the set of y erasure codes based, at least in part, on a generator matrix.

8. The method of claim 7, comprising receiving information concerning the generator matrix, where reconstructing the message depends, at least in part, on the generator matrix.

9. The method of claim 7, where the provider identifies a set of sites that are using members of the set of y erasure codes and provides information about the generator matrix to the set of sites.

10. The method of claim 9, where the provider selects first members of the y erasure codes to be replicated, selects replication members of the set of sites to receive the first members, and replicates the selected first members to the replication members.

11. The method of claim 10, where the provider provides information about the first members and the replication members to selected members of the set of sites.

12. The method of claim 10, where the provider selects an erasure code to be replicated based, at least in part, on a probability that the erasure code will be read exceeds a first threshold.

13. The method of claim 10, where the provider selects second members of the y erasure codes to be distributed, selects distribution members of the set of sites to receive the second members, and distributes the second members to the distribution members.

14. The method of claim 13, where the provider provides information about the second members and the distribution members to the selected members of set of sites.

15. The method of claim 13, where the provider selects an erasure code to be duplicated based, at least in part, on a probability that the erasure code will be read is less than a second threshold.

16. The method of claim 7, where the provider causes one or more of the y erasure codes to be stored, unencrypted, in a publicly accessible storage.

17. An apparatus, comprising:
a processor;
a data store that stores a set of erasure codes associated with a message, where the set is sufficient to reconstruct the message;
a memory that stores electronic data that identifies a provider from which an additional erasure code associated with the message can be requested;
a set of logics; and
an interface that connects the processor, the memory, and the set of logics;
the set of logics comprising:
a first logic that, upon detecting that the set of erasure codes is insufficient to reconstruct the message, sends a request for an additional erasure code associated with the message to the provider, where the request identifies members of the set of erasure codes that are currently available for reconstructing the message; and
a second logic that, upon detecting that an additional erasure code has been received in response to the request, selectively stores the additional erasure code in the data store upon determining that the additional erasure code is not already stored in the data store.

18. The apparatus of claim 17, comprising a third logic that, upon detecting an incoming request for an additional erasure code from a requester, selectively provides a member of the set of erasure codes to the requester.

19. The apparatus of claim 18, where the third logic provides an erasure code that the requester did not identify in the incoming request.

20. The apparatus of claim 18, where the third logic prioritizes providing an erasure code from which the message can be reconstructed without decoding over an erasure code from which the message can be reconstructed with decoding.

21. The apparatus of claim 17, comprising a fourth logic that, upon detecting that an additional erasure code has been added to the data store, attempts to reconstruct the message from the erasure codes stored in the data store.

22. A non-transitory computer-readable medium storing computer-executable instructions that when executed by a computer cause the computer to perform a method, the method comprising:
generating a plurality of erasure codes for a message;
replicating selected members of the plurality of erasure codes to one or more replication receivers;
duplicating selected members of the plurality of erasure codes to one or more duplication receivers; and
upon determining that a user of the erasure codes does not have enough erasure codes to reconstruct the message, providing a selected member of the plurality of erasure codes to the user.

23. The non-transitory computer-readable medium of claim 22, where generating the plurality of erasure codes depends, at least in part, on a generator matrix, and where the method includes providing the generator matrix to selected members of the replication receivers.

24. The non-transitory computer-readable medium of claim 22, where providing a selected member of the plurality of erasure codes includes controlling a replication receiver to send an additional erasure code to the user.

25. The non-transitory computer-readable medium of claim 22, where providing a selected member of the plurality of erasure codes includes controlling a duplication receiver to send an additional erasure code to the user.

26. The non-transitory computer-readable medium of claim 22, the method comprising storing selected members of the plurality of erasure codes in a public data store.

27. The non-transitory computer-readable medium of claim 22, the method comprising storing selected members of the plurality of erasure codes in a public data store without encrypting the selected members of the plurality of erasure codes.

* * * * *